(12) United States Patent
Hamilton et al.

(10) Patent No.: US 6,778,442 B1
(45) Date of Patent: Aug. 17, 2004

(54) METHOD OF DUAL CELL MEMORY DEVICE OPERATION FOR IMPROVED END-OF-LIFE READ MARGIN

(75) Inventors: Darlene G. Hamilton, San Jose, CA (US); Edward Hsia, Saratoga, CA (US); Kulachet Tanpairoj, Palo Alto, CA (US); Alykhan Madhani, Santa Clara, CA (US); Mimi Lee, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/422,092

(22) Filed: Apr. 24, 2003

(51) Int. Cl.$^7$ .............................................. G11C 11/34
(52) U.S. Cl. .............................. 365/185.28; 365/185.22
(58) Field of Search ........................ 365/185.22, 185.28

(56) References Cited

U.S. PATENT DOCUMENTS

| | | | | |
|---|---|---|---|---|
| 5,523,972 A | * | 6/1996 | Rashid et al. ........... | 365/185.22 |
| 6,215,702 B1 | | 4/2001 | Derhacobian et al. . | 365/185.29 |
| 6,246,611 B1 | | 6/2001 | Pawletko et al. ....... | 365/185.29 |
| 6,295,228 B1 | | 9/2001 | Pawletko et al. ....... | 365/185.22 |
| 6,307,784 B1 | | 10/2001 | Hamilton et al. ....... | 365/185.22 |
| 6,309,926 B1 | | 10/2001 | Bell et al. ................... | 438/257 |
| 6,331,951 B1 | | 12/2001 | Bautista, Jr. et al. ... | 365/185.22 |
| 6,344,994 B1 | | 2/2002 | Hamilton et al. ....... | 365/185.05 |
| 6,356,482 B1 | | 3/2002 | Derhacobian et al. . | 365/185.29 |
| 6,370,061 B1 | | 4/2002 | Yachareni et al. ...... | 365/185.22 |
| 6,400,624 B1 | | 6/2002 | Parker et al. ................ | 365/201 |
| 6,442,074 B1 | | 8/2002 | Hamilton et al. ....... | 365/185.29 |
| 6,456,533 B1 | | 9/2002 | Hamilton et al. ....... | 365/185.22 |

OTHER PUBLICATIONS

*Intel StrataFlash Memory Technology*, Intel Corporation, AP–677, Application Note, Dec. 1998, Order No. 297859–002.

* cited by examiner

*Primary Examiner*—M. Tran
(74) *Attorney, Agent, or Firm*—Renner, Otto, Boisselle & Sklar, LLP

(57) ABSTRACT

A method of programming a dual cell memory device having a first charge storing cell and a second charge storing cell. According to one aspect of the method, the method can include over-erasing the first and second charge storing cells to shift an erase state threshold voltage of the memory device to be lower than a natural state threshold voltage. According to another aspect of the method, the method can include programming the first and second charge storing cells to the same data state and verifying that the second programmed charge storing cell stores charge corresponding to the data state. If the verification fails, both charge storing cells can be re-pulsed.

28 Claims, 3 Drawing Sheets

METHOD OF DUAL CELL MEMORY DEVICE OPERATION FOR IMPROVED END-OF-LIFE READ MARGIN

TECHNICAL FIELD

The present invention relates generally to the field of non-volatile memory devices and, more particularly, to a method of storing data using a flash memory device, such as a dual cell, charge trapping dielectric, electrically erasable and programmable memory device.

BACKGROUND

A pervasive trend in modern integrated circuit manufacture is to increase the amount of data stored per unit area on an integrated circuit memory unit, such as a flash memory unit. Memory units often include a relatively large number of core memory devices (sometimes referred to as core memory cells). For instance, a conventional dual cell memory device, such as a charge trapping dielectric flash memory device, can store data in a "double-bit" arrangement. That is, one bit (i.e., a binary data value have two states, such as a logical one and a logical zero) can be stored using a charge storing cell on a first "side" of the memory device and a second bit can be stored using a complimentary charge storing cell on a second "side" of the memory device.

Programming of such a memory device can be accomplished, for example, by hot electron injection. Hot electron injection involves "pulsing" the device by applying appropriate voltage potentials to each of a gate and a drain of the memory device for a specified duration. During the programming pulse, the source is typically grounded. Reading of the memory device can be accomplished by applying an appropriate voltage to each of the gate and the drain and comparing the drain to source current (as an indication of device threshold voltage) against a reference value to determine if the read charge trapping cell is in a programmed or an unprogrammed state.

Even though conventional charge trapping dielectric flash memory devices are capable of storing two single-bit binary data values per memory device, conventional charge trapping dielectric flash memory devices can suffer from data retention problems, especially over repeated program/erase (P/E) cycles. The causes of data retention problems can include charge loss and complimentary bit disturb (e.g., when a programmed side of the memory device effects the threshold voltage of the memory device during reading of an unprogrammed side of the memory device).

As a result, there is an ever increasing demand to store data in memory devices while increasing the data retention ability and reliability characteristics of the memory devices.

SUMMARY OF THE INVENTION

According to one aspect of the invention, the invention is directed to a method of programming a charge trapping dielectric memory device having a first charge storing cell and a second charge storing cell. The method can include over-erasing the first and second charge storing cells to shift an erase state threshold voltage of the memory device to be lower than a natural state threshold voltage; programming the first charge storing cell to store a first amount of charge corresponding to a first program state selected from a blank program level and a first charged program level; and programming the second charge storing cell to store a second amount of charge corresponding to a second program state selected from the blank program level and a second charged program level.

According to another aspect of the invention, the invention is directed to a method of programming a charge trapping dielectric memory device having a first charge storing cell and a second charge storing cell. The method can includes programming the first charge storing cell to store a first amount of charge corresponding to a charged program level; programming the second charge storing cell to store a second amount of charge corresponding to the charged program level; and verifying that the second programmed charge storing cell stores charge corresponding to the charged program level and if the verification fails, re-pulsing each of the first programmed charge storing cell and the second programmed charge storing cell.

According to yet another aspect of the invention, the invention is directed to a method of programming a charge trapping dielectric memory device having a first charge storing cell and a second charge storing cell. The method can includes programming the first charge storing cell to store a first amount of charge corresponding to a charged program level; programming the second charge storing cell to store a second amount of charge corresponding to the charged program level; and verifying that the first programmed charge storing cell stores charge corresponding to the charged program level and if the verification fails, re-pulsing each of the first programmed charge storing cell and the second programmed charge storing cell.

BRIEF DESCRIPTION OF DRAWINGS

These and further features of the present invention will be apparent with reference to the following description and drawings, wherein.

DISCLOSURE OF INVENTION

Figure 1:
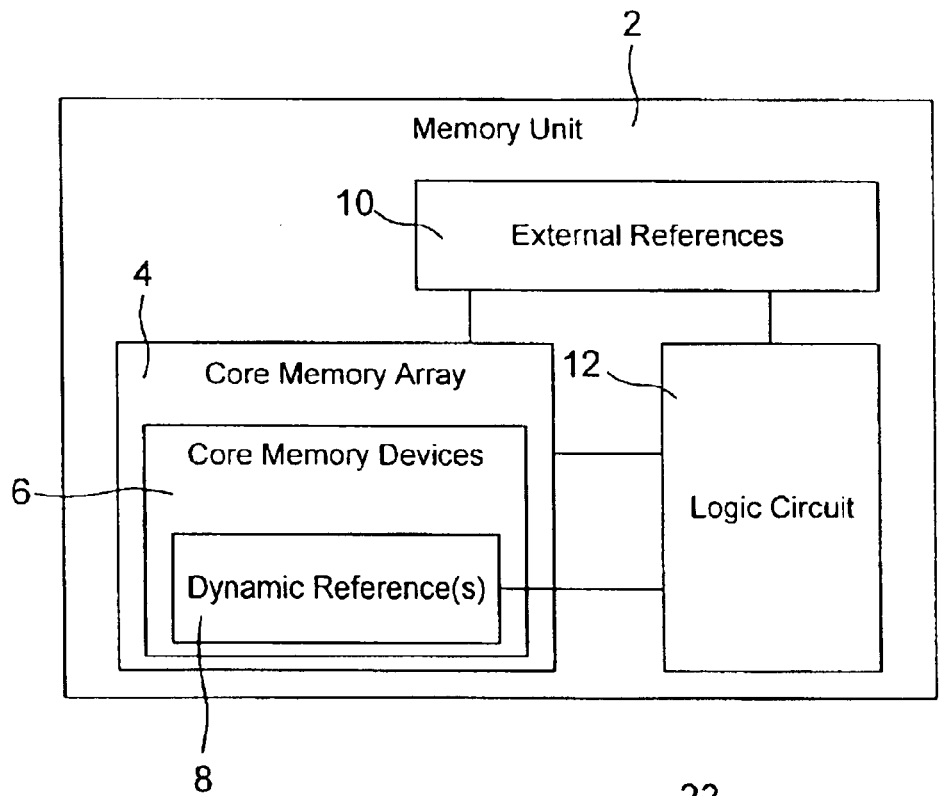
FIG. 1 is a schematic block diagram of an exemplary memory unit having a plurality of core memory devices to which a method of programming in accordance with the present invention can be applied.

In the detailed description that follows, like components have been given the same reference numerals, regardless of whether they are shown in different embodiments of the present invention. To illustrate the present invention in a clear and concise manner, the drawings may not necessarily be to scale and certain features may be shown in somewhat schematic form.

With reference to FIG. 1, shown is a schematic block diagram of an exemplary memory unit 2. The memory unit 2 can include a core memory array 4 containing a plurality of memory devices, such as dual cell, non-volatile, flash electrically erasable and programmable memory devices. For example, the memory devices can be charge trapping dielectric flash memory devices as will be discussed in greater detail below.

The memory devices of the core memory array 4 can include a plurality of core memory devices 6 and associated dynamic reference memory devices 8. In one embodiment, the array 4 can be arranged such that the dynamic reference memory devices 8 are formed within a matrix of the core memory devices 6.

Other memory devices, such as external references 10, can also form a part of the memory unit 2. The external reference 10 are separate from the core memory array 4 and can include, for example, erase verify reference cells, program verify reference cells and soft programming reference cells.

As one skilled in the art will appreciate, the core memory devices 6 can be used by a customer of the memory unit 2 to store information, such as data or executable code. The dynamic references 8 can be used to assist in reading the core memory devices 6. More specifically, the dynamic references 8 are used as indicators of the data level behavior of the core memory devices 6. Various operations of the memory unit 2, including, for example, programming, verifying, reading and erasing, can be controlled by a logic circuit 12.

Figure 2:
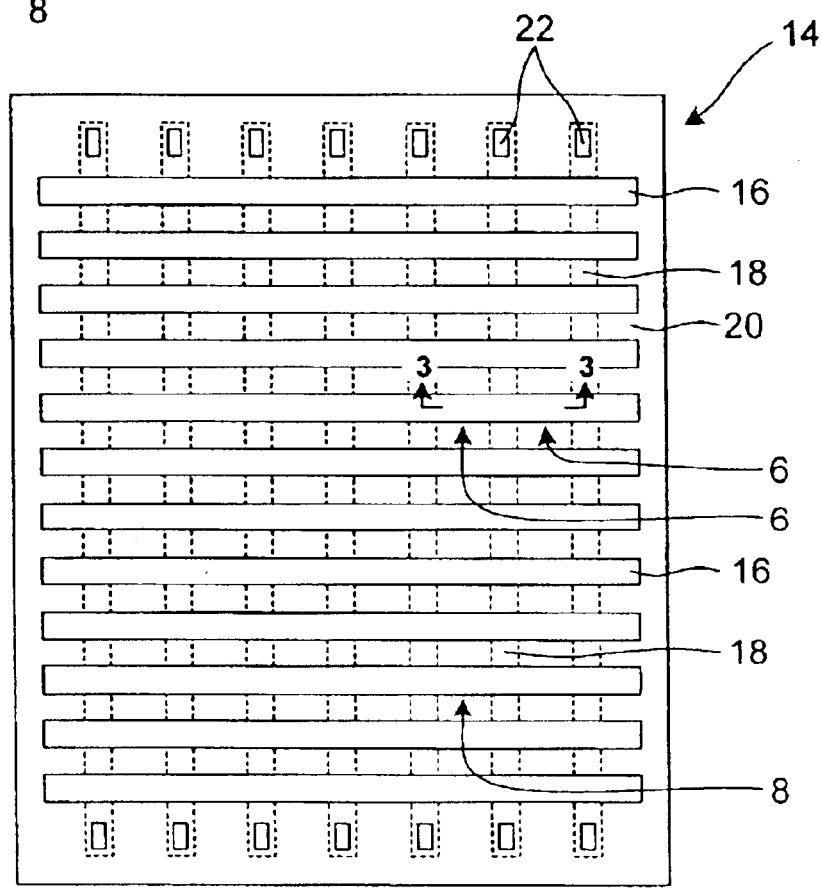
FIG. 2 is a schematic block diagram of a portion of a core memory array from the memory unit that can include the core memory devices.

With additional reference to FIG. 2, shown is a top view, schematic block diagram of a portion, or sector 14, of the core memory array 4 from the memory unit 2. The sector 14 can include core memory devices 6 and one or more dynamic reference devices 8. The sector 14 can include word lines 16 and bit lines 18 arranged with a dielectric stack 20 to operatively form the core memory devices 6 and the dynamic reference device(s) 8. Application of appropriate voltages to the word lines 16 and the bit lines 18 allows for the addressing of the memory devices 6, 8 of the sector 14 such that each memory device can be programmed, read, verified and/or erased. Bit line contacts 22 can be used to establish electrical connection to the bit lines 18 through the dielectric stack 20.

Figure 3:
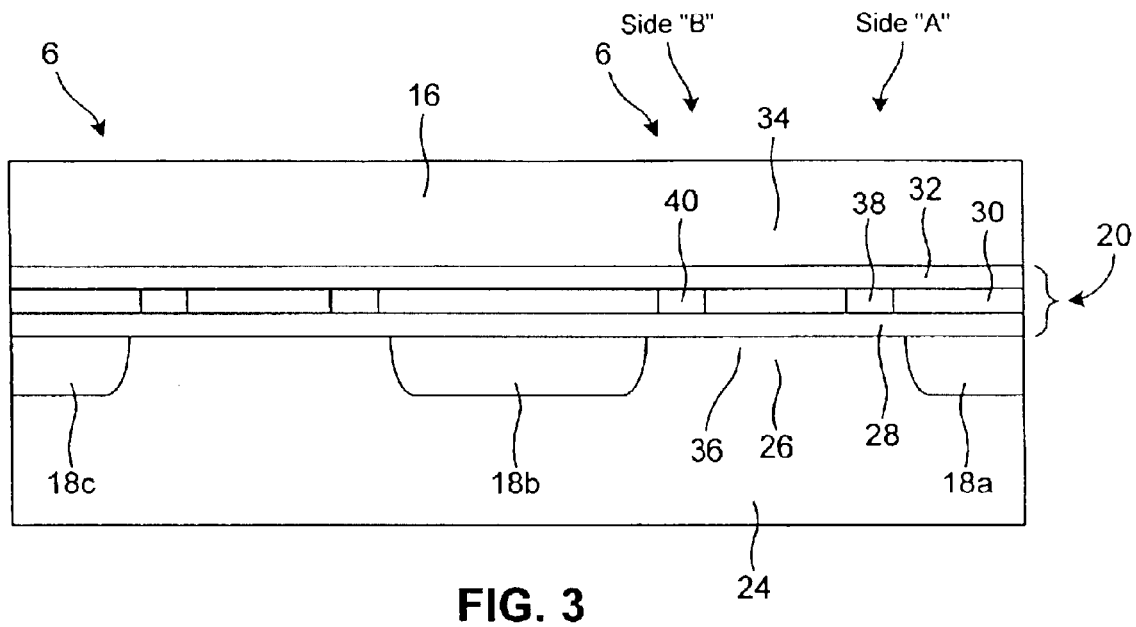
FIG. 3 is a schematic cross-section illustration of exemplary core memory devices from the core memory array taken along the line 3—3 of FIG. 2.

With additional reference to FIG. 3, a portion of the sector 14 is illustrated in cross-section to illustrate an exemplary arrangement of the memory devices of the core memory array 4. The cross-section of FIG. 3 shows two core memory devices 6. Each of the core memory devices 6, as well as the dynamic reference memory devices 8, can be implemented as a virtual ground, dual cell, nonvolatile, flash electrically erasable and programmable memory devices. It should be understood that the illustrated memory devices 6 are shown for exemplary purposes and can be implemented with alternative structures (e.g., in stacked gate arrangement, in recessed gate arrangement, etc.). In addition, the relative positioning of the core memory devices 6 with respect to the dynamic reference 8 can be modified.

The exemplary memory devices 6 are implemented as a charge trapping dielectric type flash memory devices, each of which includes a pair of complimentary charge trapping regions 38, 40 that can be independently programmed and read.

For simplicity of the discussion herein, only the arrangement of one core memory device 6 will be described. However, the remaining core memory devices 6 and the dynamic reference memory devices 8 can have a corresponding structure and operation.

In the illustrated embodiment, the core memory device 6 includes a P-type semiconductor substrate 24. Within the substrate 24, the bit lines 18 are formed in a buried bit line format. The bit lines 18 (also referred to herein as conductive regions) can be formed by implanting N-type dopant into the substrate 24, or from a metal or metal containing compound (e.g., silicide bit lines 18). For each device 6, adjacent pair of bit lines 18 form conductive regions that function as a source and a drain during various programming and reading operations. For each device, a body 26 is disposed between the adjacent pairs of bit lines 18. Although not illustrated, a nitride layer can be formed over the bit lines 18 and P+ pocket implants can be added adjacent the bit lines 18.

Above the substrate 24 is the dielectric stack 20. The dielectric stack 20 includes a bottom dielectric layer 28 (also referred to as a tunneling dielectric layer) that is made from, for example, silicon oxide ($SiO_2$), other standard-K material (e.g., have a relative permittivity below ten) or a high-K material (e.g., have a relative permittivity, in one embodiment, above ten and, in one embodiment, above twenty).

Over the bottom dielectric layer 28 is a charge trapping layer (also referred to as a charge storing layer 30). The charge storing layer 30 can be made from, for example, a nonconductive material including silicon nitride ($Si_3N_4$) or other suitable material.

Over the charge storing layer 30 is another dielectric layer (also referred to as a top dielectric layer 32) made from a material such as, for example, silicon oxide, other standard-K material or a high-K material.

The word lines 16 are formed over the top dielectric layer 32. For each core memory device 6, one of the word lines 16 functions as a gate electrode 34. The word lines 16 can be formed from, for example, polycrystalline silicon. In alternative arrangements, the gate electrodes 34 can be formed from interconnected conductive islands or pads. A work function of the word line 16 and the dielectric stack 20 controls a channel 36 within the body 26, extending from one bit line 18 to an adjacent bit line 18.

As one skilled in the art will appreciate, modifications to the core memory devices 6 can be made. Such modifications can include changes to the physical arrangement of the core memory device 6, materials used, doping parameters and the like. However, the programming, verifying, reading and/or erasing techniques described herein can be used in conjunction with such a modified device.

The core memory devices 6 can be configured as virtual ground devices. That is, during various operations of the memory devices 6 either of the bit lines 18 associated with the memory device 6 can function as a source of electrons or holes by respectively controlling the voltage potentials applied to the corresponding bit lines 18. In addition, the bit line 18 that functions as the source of electrons and/or holes can be grounded or can be connected to a bias potential.

As will become more apparent from the discussion below, within the charge storing layer 30, the core memory device 6 includes a first charge storing region (also referred to herein as a normal cell, a right-hand bit or a first charge storing cell 38) adjacent one of the conductive regions (e.g., the bit line identified as bit line 18a) and a second charge storing region (also referred to herein as a complimentary cell, a left-hand bit or a second charge storing cell 40) adjacent the other of the conductive regions (e.g., the bit line identified as bit line 18b).

In the illustrated embodiment, the core memory device 6 is a structurally symmetrical device allowing for programming, verifying, reading and erasing of the first charge storing cell 38 and the second charge storing cell 40 by respectively switching the roles of the bit lines 18a and 18b (source and drain) during those operations. Therefore, the bit lines 18a, 18b will be referred to interchangeably by the terms source and drain, depending on the charge storing cell 38, 40 of interest.

For simplicity of the drawing figures, the memory device 6 will also be referred to as having a first side, or side A, and a second side, or side B. In the illusirated example, the first charge storing cell 38 is located on side A and the second charge storing cell 40 is located on side B. However, as with the terms source and drain, the terms side A and side B can be used interchangeably.

In one embodiment, referred to herein as a "single-bit" embodiment, each charge storing cell 38, 40 can have two data states. However, each charge storing cell 38, 40 is programmed to stored the same data state to enhance data retention. To determine the data state stored by each charge storing cell 38, 40, only one of the charge storing cells 38, 40 needs to be read.

In another embodiment, referred to herein as a "dual-bit" embodiment, each charge storing cell 38, 40 can independently have two data states. That is, each charge storing cell 38, 40 can be programmed to either of the data states to take advantage of the asymmetrical date storage capability of the core memory device 6. To determine the data state stored by each charge storing cell 38, 40, each of the charge storing cells 38, 40 can be read in separate read operations.

In the single-bit embodiment and the dual-bit embodiment, the data states can represent binary values such as a logical zero and a logical one. The logical one, for example, can be implemented by leaving the desired charge storing cell 38, 40 in an unprogrammed state, also referred to as a blank program level. The logical zero, for example, can be implemented by storing an amount of charge in the desired charge storing cell 38, 40. This condition is also referred to as a charged state, a programmed state, a programmed level or a charged program level.

In another embodiment, referred to herein as a "single-bit multi-level cell (MLC)" embodiment or "single-bit MLC" embodiment, each charge storing cell 38, 40 can have multiple data states, such as four data states. However, each charge storing cell 38, 40 is programmed to stored the same data state to enhance data retention. To determine the data state stored by each charge storing cell 38, 40, only one of the charge storing cells 38, 40 needs to be read. Therefore, in the single-bit MLC embodiment, each core memory device 6 (or "transistor") has four data states (i.e., the four data states associated with the read charge storing cell 38, 40). In another embodiment there can be more than three charged program levels.

In another embodiment, referred to herein as a "quad-bit" embodiment, each charge storing cell 38, 40 can independently have multiple data states, such as four data states. That is, each charge storing cell 38, 40 can be programmed to any of the multiple data states to take advantage of the asymmetrical date storage capability of the core memory device 6. To determine the data state stored by each charge storing cell 38, 40, each of the charge storing cells 38, 40 can be read in separate read operations. Therefore, in the quad-bit embodiment, each core memory device 6 (or "transistor") has sixteen data states (i.e., between the associated pair of charge storing cells 38, 40, there are sixteen permutations of the blank program level and the three charged program levels). In another embodiment there can be more than three charged program levels.

In the single-bit MLC embodiment and the quad-bit embodiment, the data states of the individual charge storing cells 38, 40 can represent a two bit binary word, such as a logical zero-zero, logical zero-one, logical one-zero and logical one-one. The logical one-one data state, for example, can be implemented by leaving the desired charge storing cell 38, 40 in an unprogrammed state, also referred to as a blank program level which will be referred to herein as "level A". The other logical data states, for example, can be implemented by storing distinguishable amounts of charge in the desired charge storing cell 38, 40, which are also referred to as a charged states, programmed states, programmed levels or charged program levels. A lowest charged program level corresponding to the one-zero data state will be referred to herein as "level B". A medium charged program level corresponding to the zero-one data state will be referred to herein as "level C". A highest charged program level corresponding to the zero-zero data state will be referred to herein as "level D". In another implementation of the single-bit MLC embodiment and the quad-bit embodiment, there can be more than three charged program levels.

For purposes of the present disclosure, the programming technique to store charge with either of the charge storing cells 38, 40 involves hot electron injection, also referred to as channel hot electron injection (CHE). However, it should be appreciated that modifications to the programming techniques can be made to accommodate variations in the specific memory device used.

Using hot electron injection, the first charge storing cell 38 can be programmed to the desired charged program level (in the single-bit and dual-bit embodiments, the single charged program level or in the single bit MLC and quad-bit embodiments, any of the multiple charged program levels) by applying a selected voltage to the bit line 18a (functioning as the drain) adjacent the first charge storing cell 38. In addition, a selected voltage is applied to the word line 16 (functioning as the gate electrode 34). The other bit line 18b functions as the source (i.e., source of electrons) for the CHE programming of the first charge storing cell 38. In one embodiment, a bias voltage potential is applied to the source (rather than grounding or floating the source as found in conventional charge trapping dielectric flash memory devices). As a result of the application of a bias potential to the source during programming, greater control over electron injection can be accomplished, which can lead to enhanced data retention capability of the memory device 6 and/or greater charge injection accuracy for achieving the desired charged program level.

The voltages applied to the gate electrode 34, the source and the drain generate a vertical electric field through the dielectric layers 28, 32 and the charge storing layer 30 and a lateral electric field along the length of the channel 36 from the source to the drain. At a given threshold voltage, the channel 36 will invert such that electrons are drawn off the source and begin accelerating toward the drain. As the electrons move along the length of the channel 36, the electrons gain energy and upon attaining enough energy, the electrons are able to jump over the potential barrier of the bottom dielectric layer 28 and into the charge storing layer 30 where the electrons become trapped. The probability of electrons jumping the potential barrier is a maximum in the area of the charge storing cell 38 adjacent the drain (i.e., bit line 18a), where the electrons have gained the most energy. These accelerated electrons are termed hot electrons and once injected into the charge storing layer 30, stay in the charge storing cell 38 of the charge storing layer 30. The trapped electrons tend not to spread through the charge storing layer 30 due to this layer's low conductivity and low lateral electric field therein. Thus, the trapped charge remains localized in the charge trapping region of the charge storing cell 38 close to the adjacent bit line 18a.

The foregoing technique to program the first charge storing cell 38 can be used to program the second charge storing cell 40, but the functions of the bit lines 18a and 18b (i.e., source and drain) are reversed.

Figure 4:
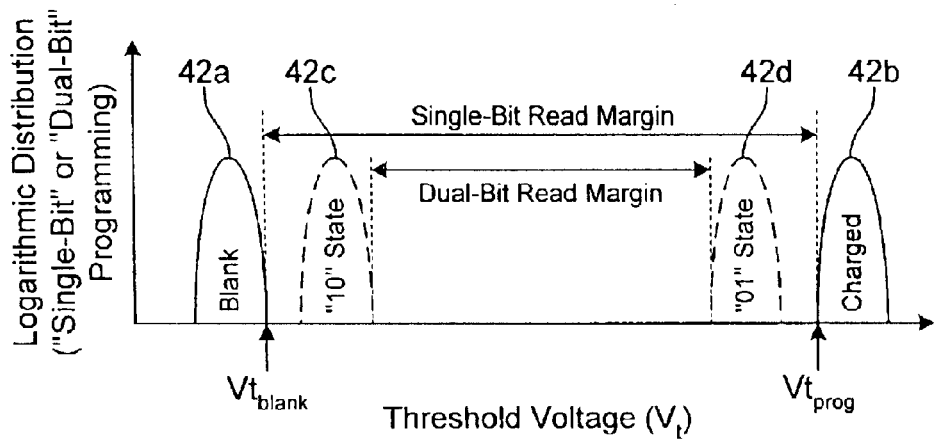
FIG. 4 is a population plot that includes relative program level threshold voltage distributions for "single-bit" and "dual-bit" programming of a charge storing cell from the core memory device.

With additional reference to FIG. 4, shown is a population plot that includes relative program level threshold voltage (Vt) distributions 42 for single-bit and dual-bit programming of a charge storing cell 38, 40 from the core memory device 6. The threshold voltage distributions 42 are indicative of the data state behavior of the core memory device 6 when the charge storing cells 38, 40 are placed in various respective data states.

A first distribution 42a represents a logarithmic threshold voltage distribution for the memory device 6 when both charge storing cells 38, 40 store respective charge amounts corresponding to the blank program level. That is, when one of the charge storage cells 38, 40 is read and both charge storing cells 38, 40 are in the blank state, the threshold voltage of the memory device 6 should fall within the first distribution 42a. Using the corresponding binary data values for this data storage condition, the first distribution 42a can be referred to as a "11" state, where the first "1" of the "11" corresponds to charge storing cell 38, 40 being read (or "read bit") and the second "1" of the "11" corresponds to the other of the charge storing cells 38, 40 (or "unread bit"). A maximum value of the first distribution 42a represents an erase or blank threshold voltage ($Vt_{blank}$) of the core memory device 6.

A second distribution 42b represents a logarithmic threshold voltage distribution for the core memory device 6 when both charge storing cells 38, 40 store respective charge amounts corresponding to the charged program level. That is, when one of the charge storage cells 38, 40 is read and both charge storing cells 38, 40 are in the charged state, the threshold voltage of the memory device 6 should fall within the second distribution 42b. Using the corresponding binary data value for this data storage condition, the second distribution 42b can be referred to as a "00" state, where the first "0" of the "00" corresponds to the read bit and the second "0" of the "00" corresponds to the unread bit.

A third distribution 42c represents a logarithmic threshold voltage distribution for the core memory device 6 when the read one of the charge storing cells 38, 40 stores a charge amount corresponding to the blank program level and the unread one of the charge storing cells 38, 40 stores a charge amount corresponding to the charged program level. Using the corresponding binary data value for this data storage condition and the first and second digit naming convention identified above, the third distribution 42c can be referred to as a "10" state. The "10" state can also be referred to as a complimentary bit disturb (CBD) state since the charge stored by the unread bit has the effect of slightly increasing the threshold voltage of the memory device 6 above the blank state distribution 42a.

A fourth distribution 42d represents a logarithmic threshold voltage distribution for the core memory device if the read one of the charge storing cells 38, 40 stores a charge amount corresponding to the charged program level and the unread one of the charge storing cells 38, 40 stores a charge amount corresponding to the blank program level. Using the corresponding binary data value for this data storage condition and the first and second digit naming convention identified above, the third distribution 42b can be referred to as a "01" state. In this situation, the differing charge amounts stored by the charge storing cells 38, 40 has the effect of slightly decreasing the threshold voltage of the memory device 6 below the programmed state distribution 42b.

Figure 5:
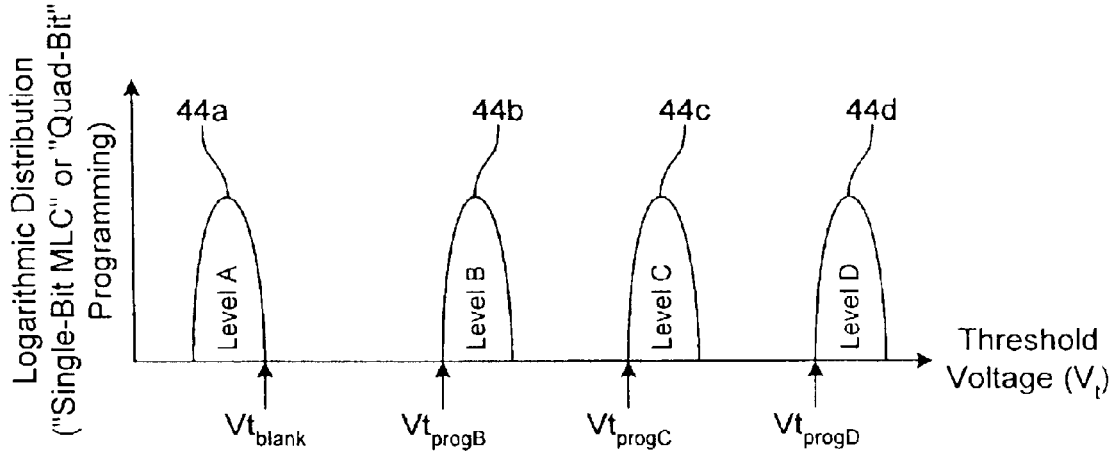
FIG. 5 is a population plot that includes relative program level threshold voltage distributions for "single-bit multi-level cell (MLC)" and "quad-bit" programming of a charge storing cell from the core memory device.

With additional reference to FIG. 5, shown is a population plot that includes relative threshold voltage (Vt) distributions 44 for single-bit MLC and quad-bit programming of a charge storing cells 38, 40 from the core memory device 6. The blank state, or level A, is represented by distribution 44a, level B is represented by distribution 44b, level C is represented by distribution 44c and level D is represented by distribution 44d. Relative threshold voltage distributions for the data states of the other of the charge storing cells 38, 40 of the core memory device 6 would have similar appearance to those illustrated in FIG. 5. For simplicity of the drawing figures attached hereto, CBD threshold voltage distributions similar to the CBD threshold distributions 42c and 42d (FIG. 4) illustrated for the single bit and dual bit embodiments are not illustrated in FIG. 5. However, when the charge storing cells 38, 40 are programmed to dissimilar data states, the threshold voltage distributions 44 can have a tendency to shift upward or downward along the threshold voltage axis as a result of CBD.

A combination of program conditions (discussed below in greater detail) can be selected such that when the target charge storing cell 38, 40 is programmed to level D, the amount of charged stored by the cell 38, 40 is higher than the amount of charge stored by the cell 38, 40 when the cell 38, 40 is programmed to level C. In one embodiment, a minimum threshold voltage ($Vt_{progD}$) of the level D distribution 44d is about one volt higher than a maximum threshold voltage of the level C distribution 44c. Similarly, the amount of charged stored by the cell 38, 40 programmed to level C is higher than the amount of charge stored by the cell 38, 40 when the cell 38, 40 is programmed to level B. In one embodiment, a minimum threshold voltage ($Vt_{progC}$) of the level C distribution 44c is about one volt higher than a maximum threshold voltage of the level B distribution 44b. Similarly, the amount of charged stored by the cell 38, 40 programmed to level B is higher than the amount of charge stored by the cell 38, 40 when the cell 38, 40 is programmed to level A. In one embodiment, a minimum threshold voltage ($Vt_{progB}$) of the level B distribution 44b is about 1.5 volts higher than a maximum threshold voltage of the level A distribution 44a, or the erase threshold voltage ($Vt_{blank}$).

It is noted that the threshold voltage distribution 42a for the blank state of the single-bit and dual-bit embodiments can correspond to the threshold voltage distribution 44a for the blank state of the single-bit MLC and quad-bit embodiments (e.g., the minimum, maximum and peak distribution points can be the same or approximately the same). Similarly, the threshold voltage distribution 42b for the charged program state of the single-bit and dual-bit embodiments can correspond to the threshold voltage distribution 44d for the highest charge program state of the single-bit MLC and quad-bit embodiments (e.g., the minimum, maximum and peak distribution points can be the same or approximately the same).

Reading of the cells 38, 40 of the core memory device 6 can be carried out using, for example, a reverse read operation. For example, to read the first charge storing cell 38, a voltage can be applied to the conductive region opposite the first charge storing region 38 (i.e., bit line 18b, which is also referred to as the drain during read operations) and a voltage can be applied to the gate electrode 34. The conductive region adjacent the first charge storing region 38 (i.e., bit line 18a, which is also referred to as the source during read operations) can be grounded. To read the second charge storing cell 40, the roles of the bit lines 18a and 18b can be reversed.

During the read operation, an amount of current drawn across the channel 36 can be used as an indication of core memory device 6 threshold voltage and can be compared against a reference current(s) (the reference current acting as an indication of a reference threshold voltage) to determine the data state of the "read" one of the charge storing cells 38, 40.

The read operation drain voltage functions to create a depletion region in the channel 36 under the unread charge storing cell 38, 40. This depletion region can partially mask, or "cover up," any charge stored by the unread charge storing cell 38, 40 to minimize the effect of CBD on read margin. For the dual-bit and quad bit embodiments, the drain voltage can be about 1.3 V to about 1.6 V and the gate voltage can be about five volts. For the single-bit and single-bit MLC embodiments, the drain voltage can be less than one volt (e.g., about 0.4 volts to about 0.7 volts) and the gate voltage can be about three volts.

For the single-bit embodiment, read margin can be considered the threshold voltage differential from the blank state voltage $Vt_{blank}$ to the minimum threshold voltage of the "00" state threshold voltage distribution 42b (or $Vt_{prog}$). In the dual-bit embodiment, read margin can be reduced from the maximum threshold voltage of the "10" state distribution 42c to the minimum threshold voltage distribution of the "01" state distribution 42d. Similar read margins can be derived for the single-bit MLC and quad-bit embodiments.

In general, the closer the distributions become along the threshold voltage axis, the harder it may be to generate a read operation reference (e.g., reference current or reference threshold voltage) to differentiate between the various program levels. This issue can arise with greater frequency in the single-bit MLC and the quad-bit embodiments due to the greater number of possible data state combinations that can be stored by the memory device 6.

Figure 6:
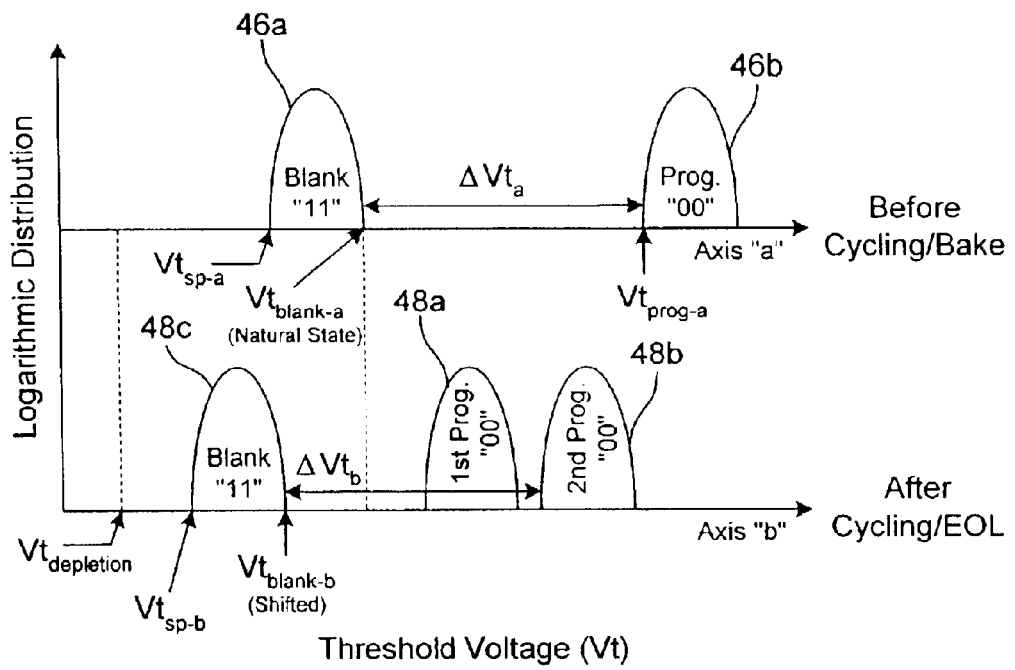
FIG. 6 is a population plot that illustrates shifting of a blank state threshold voltage distribution in accordance with the invention.

With additional reference to FIG. 6, shown is an illustration of the effect that program/erase (P/E) cycling and/or aging has on data retention of the memory device 6. For simplicity of the drawing figures, FIG. 6 illustrates these effects in the context of the single-bit embodiment. However, these effects apply to all programming embodiments described herein and, as indicated above, can become more severe when CBD is considered and/or when MLC programming is used.

FIG. 6 shows a population plot that compares relative program level threshold voltage distributions for single-bit programming of the dual cell memory device 6 before multiple program/erase (P/E) cycles and after multiple P/E cycles. More specifically, the population plot of FIG. 6 has a first axis (identified as axis "a") showing relative threshold voltage distributions 46 for the memory device 6 when the memory device 6 is relatively new (e.g., has been not be cycled through multiple P/E operations, such as anywhere from one to over a million P/E cycles) and/or when the memory device 6 has not be subjected to a "bake" operation to artificially age the memory device 6.

The population plot of FIG. 6 also has a second axis (identified as axis "b") showing relative threshold voltage distributions 48 for the memory device 6 when the memory device 6 has been cycled through multiple P/E operations (e.g., anywhere from one to over a million P/E cycles) and/or when the memory device 6 has been subjected to a "bake" operation to artificially age the memory device 6 to an end-of-life (EOL) state.

The first axis (or axis a) is illustrated vertically above the second axis (or axis b) such that comparison between the threshold voltage distributions 46 and threshold distributions 48 can be made.

A first threshold voltage distribution 46a represents a blank state for both charge storing cells 38, 40. Therefore, the distribution 46a can be considered to correspond to the distributions 42a and 44a. A second threshold voltage distribution 46b represents a charged program level for both charge storing cells 38, 40. Therefore, the distribution 46b can be considered to correspond to the distributions 42b and 44d.

For purposes of example herein, it will be assumed that the first charge storing cell 38 (or side A) is programmed before the second charge storing cell 40 (or side B) is programmed. However, as should be appreciated by those in the art, the order of programming can be reversed with similar results.

When the memory device 6 is relatively new, each charge storing cell 38, 40 can be programmed to a charged program level and the charge storing cells 38, 40 will have a tendency to hold the charge. Hence, read margin when the memory device is relatively new will be reasonably large. For instance, in the single-bit embodiment example of FIG. 6, a "new device" read margin ($\Delta Vt_a$) can be measured from the maximum threshold voltage of the blank state threshold voltage distribution 46a ($Vt_{blank-a}$) to the minimum threshold voltage of the programmed state threshold voltage distribution 46b ($Vt_{prog-a}$).

Over repeated P/E cycles and/or aging (e.g., "bake" cycle) of the memory device 6, the charge storing cells 38, 40 may have a tendency to experience charge loss. Charge loss can lead to poor data retention ability. One common cause of charge loss stems from degradation to the tunnel dielectric layer 28 by repeated electron and/or hole bombardment. Accordingly, charge stored by the charge storing cells 38,40 may have a tendency to be lost by dissipation through the tunnel dielectric layer 28.

It is noted that when the charge storing cells 38, 40 are "programmed" to the blank state, a relatively small amount of charge is stored in the charge trapping layer 30 and charge loss does not occur or does not occur to any appreciable amount. Therefore, when charge is lost by the charge storing cells 38, 40 that are programmed to a charged program level and the threshold voltage of the memory device 6 decreases, the read margin also decreases.

It has been found that the first programmed of the charge storing cells 38, 40 tends to lose charge faster than the second programmed of the charge storing cells 38, 40. This can result from the effect that charge stored by the first programmed charge storing cell 38, 40 can have on programming of the second programmed charge storing cell 38, 40. For instance, the previously stored charge may have a tendency to slow programming of the second programmed charge storing cell 38, 40 so that charge is laterally more distributed in the second programmed charge storing cell 38, 40 and is less likely to be lost.

Referring to the threshold voltage distributions of axis-b (FIG. 6), the threshold voltage distribution 48a can represent the "aged" threshold voltage distribution for the first programmed charge storing cell 38, 40 when the memory device 6 is programmed to the "00" state. Threshold voltage distribution 48b can represent the "aged" threshold voltage distribution for the second programmed charge storing cell 38, 40 when the memory device 6 is programmed to the "00" state. As graphically represented, the threshold voltage distribution 48b has somewhat higher threshold voltage values than the threshold distribution 48a. Therefore, the higher threshold voltage values of distribution 48b can provide for greater "aged" read margin ($\Delta Vt_b$) than for the distribution 48a. The "aged" read margin $\Delta Vt_b$ can be the differential from the blank state threshold voltage distribution 46a or, as discussed in greater detail below, a shifted blank state threshold voltage distribution 48c.

In one embodiment, read margin can be improved by shifting the blank state threshold voltage distribution 48c to have at least a lower erase threshold voltage ($Vt_{blank-b}$) than a conventional erase threshold voltage ($Vt_{blank-a}$). The conventional erase threshold voltage is typically a natural state threshold voltage of the memory device 6, or is very close to the natural state threshold voltage. More specifically, when the memory device 6 comes out of production the materials of the device will establish a natural threshold voltage such that if a voltage potential corresponding to the natural threshold voltage were applied to the gate electrode 34, electrons would begin to flow from source to drain. The production techniques may include processing using ultraviolet (UV) energy sources that can effect material properties and the resulting natural threshold voltage. Therefore, the natural state threshold voltage is sometimes referred to as a UV threshold voltage or an initial threshold voltage.

To prepare the memory device 6 for use, an erase configuration operation can be carried out. A conventional erase configuration operation can include, for example, charging each charge storing cell 38, 40 to store charge corresponding to a charged program level and then erasing each of the charge storing cells 38, 40 to return the threshold voltage of the memory device 6 to the nearly natural state blank state threshold voltage distribution 46a. Occasionally, in the conventional processing, excessive charge is removed from one or both of the charge storing cells 38, 40 during the erase portion of the erase configuration operation. Removing too much charge can broaden the width of the distribution 46a by lowering the memory device 6 threshold voltage lower than a minimum threshold voltage of the distribution 46a (also referred to as a soft-program threshold voltage ($Vt_{sp-a}$)). This condition is often referred to in the art as an over-erased charge storing cell 38, 40 and is conventionally avoided for a variety of reasons. For example, inconsistent erase state threshold voltages from device 6 to device 6 can lead to inconsistent charged program state threshold voltages from device 6 to device 6. Therefore, in conventional processing, any charge storing cell 38, 40 exhibiting a threshold voltage lower than $Vt_{sp-a}$ (as indicated by a soft-program reference voltage generated by one of the external reference devices 10) can be pulsed with a soft-programming pulse to increase the threshold voltage of the device 6.

As previously indicated, the shifted erase state threshold voltage distribution 48c is shifted relative to the conventional erase state threshold voltage distribution 46a. Although it was previously believed to be not possible to store trapped holes in the charge storing layer 30, the electric field used to erase the charge storing cells 38, 40 is relatively high and the local threshold voltage of the charge storing cells 38, 40 can be reduced below the natural state. Accordingly, the shifted erase threshold voltage $Vt_{blank-b}$ can be about 0.1 volts to about 1.0 volts lower than the natural state threshold voltage $Vt_{blank-a}$. Although $Vt_{blank-b}$ can be lower than what is conventionally thought of as being appropriate for the erase threshold voltage, this intentional "over-erasing" of the charge storage cells 38, 40 can improve EOL read margin by increasing the differential between the blank state and charged program state threshold voltages.

After the charge storing cells 38, 40 have been over-erased to shift $Vt_{blank-b}$, any charge storing cells 38, 40 that exhibit a threshold voltage lower than a shifted soft-program threshold voltage ($Vt_{sp-b}$) can be soft-programmed to inject charge into the charge storing cell 38, 40 to bring the threshold voltage of the device 6 within the shifted blank state threshold voltage distribution 48c. In one embodiment, the shifted soft-program threshold voltage $Vt_{sp-b}$ can be selected to be above a full over-erase threshold voltage ($Vt_{depletion}$) of the memory device 6 where the memory device 6 can exhibit properties of a depletion device. A depletion device could conduct current through the channel 36 when the gate electrode 34 is grounded. As should be appreciated, the soft-programming focuses on moving the threshold voltage of any charge trapping cell 38, 40 having a threshold voltage less than the desired $Vt_{sp-b}$ to be equal to or greater than $Vt_{sp-b}$. In so doing, the difference between $Vt_{blank-b}$ and $Vt_{sp-b}$ ($Vt_{blank-b}$ minus $Vt_{sp-b}$) should be approximately the same as the difference between $Vt_{blank-a}$ and $Vt_{sp-a}$ ($Vt_{blank-a}$ minus $Vt_{sp-a}$) to assist in maintaining a high level of performance of the core memory array 4 over its lifetime.

It is noted in the dual-bit and quad-bit embodiments, shifting of the blank state distributions 42a, 44a can also lower the corresponding CBD or "10" state threshold voltage distributions (e.g., distribution 42c). This is because the threshold voltages associated with the CBD state distribution are determined, in part, by the threshold voltages of the blank state distribution. As a result, read margin in the dual-bit and quad-bit embodiments can be improved by shifting the blank state threshold voltage distributions 42a, 44a by over-erasing the charge storing cells 38, 40 in the same manner that read margin in the single-bit and single-bit MLC embodiments can be improved.

Figure 7:
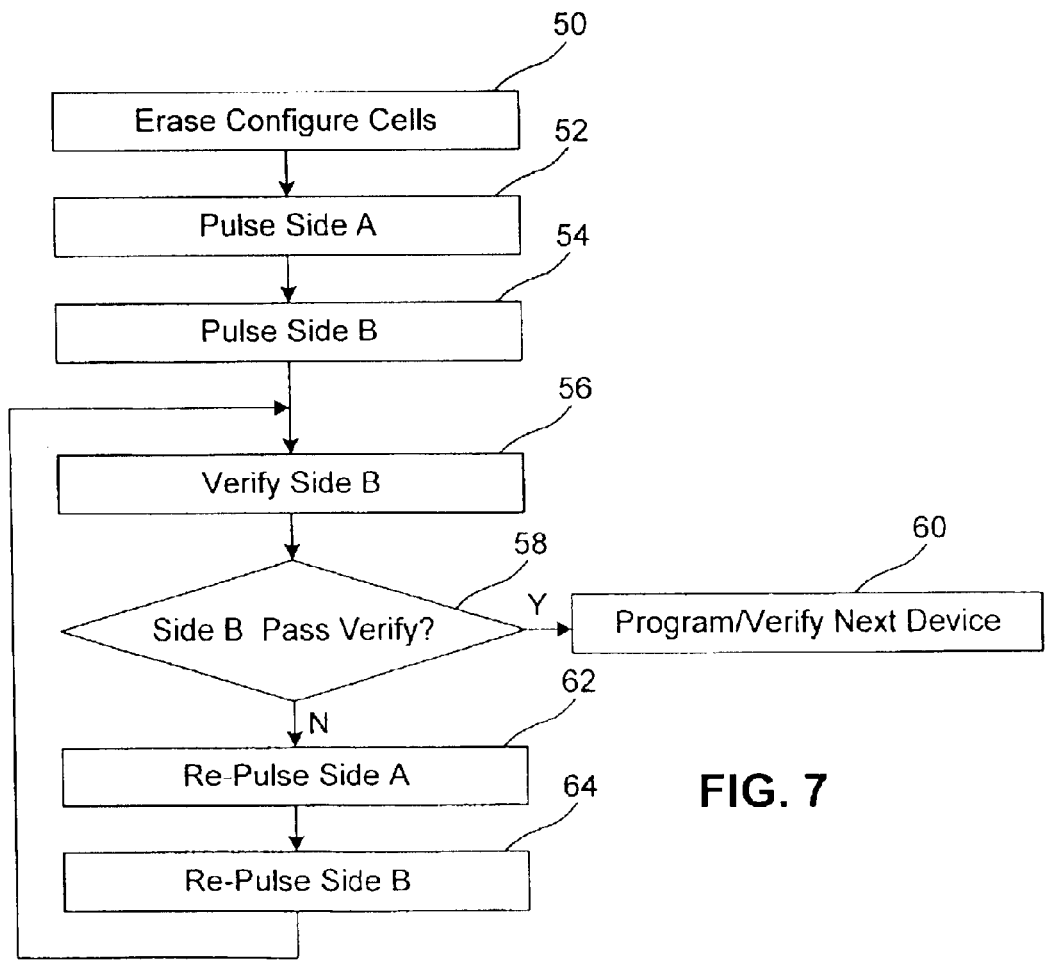
FIG. 7 is a flow diagram of a method of configuring, programming and verifying the dual cell memory device in accordance with the invention.

With additional reference to FIG. 7, a flow diagram of an erase configuration and program/verify operation for the memory device 6 when programming according to the single-bit or single-bit MLC embodiments is shown. By way of example, the flow chart of FIG. 7 carries out certain processing on a first programmed charge storing cell 38, 40 and/or a second programmed charge storing cell 38, 400 as described in greater detail below. It should be appreciated that any processing carried out with respect to a certain identified charge storing cell 38, 40 (i.e., first or second programmed) can alternatively be carried out on the other charge storing cell 38, 40 and such modifications are considered to fall within the scope of the claims appended hereto.

The method can start in block 50 where each memory device 6 associated with the memory unit can be configured. Block 50, for example, can include charging each charge storing cell 38, 40 to a charged program level and then erasing each of the charge storing cells 38, 40 such that the memory device 6 has a threshold voltage lower than or equal to the shifted blank state threshold voltage (e.g., $Vt_{blank-b}$). Erasing can be accomplished using, for example, a band-to-band (BTB), hot hole injection erase operation to remove the preprogrammed charge. As a result, the charge storing cells 38, 40 can be intentionally over-erased, or undergo any suitable "tailored erase" configuration consistent with the description herein. Thereafter, any charge storing cells 38, 40 having a charge amount resulting in a device 6 threshold voltage lower than a shifted soft-program threshold voltage (e.g., $Vt_{sp-b}$), can be soft-programmed to increase the threshold voltage of the device 6. It is noted that all memory devices 6, 8 of the core memory 4 (or a selected set of devices 6, 8) can be subjected to the erase configuration routine prior to programming of any individual memory device 6, 8.

Once the memory cell 6 is configured in block 50, the method can continue in block 52 where a first of the charge storing cells 38, 40 to be programmed is programmed to a desired program level (e.g., left in a blank state or injected with charge to store a data state associated with a desired charged program level). For example, the source, drain and gate electrode 34 can be pulsed with a set of program voltage potentials appropriate for the desired charged program level (level B, level C or level D in the single-bit MLC embodiment or the charged program level in the single-bit embodiment). By way of example, the first charge storing cell 38 on "side A" of the memory device 6 can be programmed first and the second charge storing cell 40 on "side B" of the device can be programmed second. However, it should be appreciated that the programming order can be reversed. In the single-bit and single-bit MLC embodiments, if the device 6 is to be left blank, programming with respect to the device 6 can be considered complete and the method can proceed to programming another device 6.

When programming according to the dual-bit or quad-bit embodiments, a verify operation to confirm programming of the first programmed charge storing cell 38, 40 to a desired charged program level can be carried out at this stage of the method. If needed, repulsing of the first programmed charge storing cell 28, 30 can also be carried out.

Following block 52 and in block 54, the second of the charge storing cell 38, 40 to be programmed can be programmed. Following the example where the charge storing cell 38 of side A is programmed first, the charge storing cell 40 of side B can be programed in block 54 to a desired program level. That is, the second programmed charged storing cell 38, 40 can be left in a blank state or injected with charge to store the charged program level of the first programmed charge storing cell 38, 40. As indicated, in the single-bit and the single-bit MLC embodiments, both charge storing cells 38, 40 are charged to the same program level. Therefore, both charge storing cells 38, 40 are either left in the blank state or programmed to store an amount of charge corresponding to a desired charged program level.

When programming according to the dual-bit or quad-bit embodiments, a verify operation to confirm programming of the second programmed charge storing cell 38, 40 to a desired charged program level can be carried out at this stage of the method. If needed, repulsing of the second programmed charge storing cell 38, 40 can also be carried out. Thereafter, programming of the memory device 6 in the dual-bit or quad-bit embodiments can be considered complete and the charge storing cells 38, 40 of another memory device 6 can be programmed. It is noted that charge storing cells 38, 40 of other memory devices 6 can be programmed between programming of the first programmed and second programmed charge storing cells 38, 40.

Returning to the programming techniques for the single-bit and single-bit MLC embodiments, one skilled in the art should appreciate that either of the charge storing cells 38, 40 can be programmed first, but, in one embodiment, the charge storing cell 38, 40 programmed last is the charge storing cell 38, 40 selected for interrogation during a read operation. In effect, the read operation "ignores" the threshold voltage of the first programmed charge storing cell 38, 40 and focuses on the second programmed charge storing cell 38, 40. Alternatively, the charge storing cell 38, 40 programmed first is the charge storing cell 38, 40 selected for interrogation during a read operation.

With continued reference to FIG. 7, in block 56, the second programmed charge storing cell 38, 40 is interrogated during a verify operation to ensure programming to the desired programmed level for both charge storing cell. The verify operation can be carried out in similar fashion to a reverse read operation. More specifically, a threshold voltage of the memory device 6 (e.g., as indicated by a current drawn across the channel 36) can be compared against a program-verify threshold voltage (i.e., as indicated by a current generated by an external reference 10).

In block 58, a determination of whether the memory device 6 passes the program-verify operation can be made. If the memory device 6 passes the program-verify operation, the memory device 6 can be considered programmed and the method can proceed to block 60 where another device of the core memory array 4 to be programmed is programmed according to the routine described herein (e.g., starting at block 52).

If, in block 58, then the memory cell 6 is not considered programmed, the method can proceed to block 62. In block 62, the first programmed charge storing cell 38, 40 (i.e., the charge storing cell 38, 40 pulsed in block 52) can be re-pulsed to increase the charge stored by the first programmed charge storing cell 38, 40. Thereafter, in block 64, the second programmed charge storing cell 38, 40 (i.e., the charge storing cell 38, 40 pulsed in block 54) can be repulsed to increase the charge stored by the second programmed charge storing cell 38, 40. In one embodiment, the program voltages applied during the pulses in blocks 62 and 64 can be the same as the initial program voltages used in blocks 52 and 54. In an alternative embodiment, the program voltages applied in blocks 62 and 64 can be modified from the initial program voltages used in blocks 52 and 54. For example, the program voltages can be changed based on the number of times the memory device 6 has been pulsed or on the current threshold voltage of the memory device 6.

After the charge storing cells 38, 40 have been respectively repulsed in blocks 62 and 64, the method can return to block 56 where programming of the memory device 6 is re-verified according to the techniques described above.

After all of the memory devices 6, 8 that require programming as indicated by the data pattern being stored have been programmed, the method illustrated in FIG. 7 can end and the memory array 4 can read and/or erased/reprogrammed.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of programming a charge trapping dielectric memory device having a first charge storing cell and a second charge storing cell, comprising:

over-erasing the first and second charge storing cells to shift an erase state threshold voltage of the memory device to be lower than a natural state threshold voltage;

programming the first charge storing cell to store a first amount of charge corresponding to a first program state selected from a blank program level and a first charged program level; and programming the second charge storing cell to store a second amount of charge corresponding to a second program state selected from the blank program level and a second charged program level.

2. The method according to claim 1, wherein the first program state and the second program state are the same.

3. The method according to claim 2, wherein the first and the second charged program levels are selected from a plurality of charged program levels.

4. The method according to claim 2, wherein the charge storing cell programmed first is susceptible to losing charge at a faster rate than the charge storing cell programmed second.

5. The method according to claim 2, further comprising reading the second programmed charge storing cell to determine a data value corresponding to each of the first and second programmed states.

6. The method according to claim 5, wherein the charge storing cells are regions of a charge storing layer that is operatively arranged with a first conductive region adjacent the first charge storing cell, a second conductive region adjacent the second charge storing cell and a gate electrode and during reading, a voltage potential is applied to the conductive region adjacent the unread one of the charge storing cells, the voltage potential being less than one volt.

7. The method according to claim 6, wherein the voltage potential applied to the conductive region adjacent the unread one of the charge storing cells is about 0.4 volts to about 0.7 volts.

8. The method according to claim 2, further comprising verifying that the second programmed charge storing cell stores charge corresponding to the charged program level.

9. The method according to claim 8, wherein charge stored by the first programmed charge storing cell is not verified.

10. The method according to claim 8, wherein if the verification fails, the method further comprises re-pulsing the first programmed charge storing cell and then re-pulsing the second programmed charge storing cell.

11. The method according to claim 1, wherein the first and the second charged program levels are selected from a plurality of charged program levels.

12. The method according to claim 1, wherein the charge storing cells are regions of a charge storing layer that is operatively arranged with a first conductive region adjacent the first charge storing cell, a second conductive region adjacent the second charge storing cell and a gate electrode and storing the charge program levels for each charge storing cell respectively includes applying a source bias voltage potential to the conductive region adjacent the programmed charge storing cell.

13. The method according to claim 1, wherein each charge storing cell is configured such that there is one charged program level for the first and second program levels.

14. The method according to claim 13, wherein the first program state and the second program state are the same.

15. The method according to claim 1, wherein each charge storing cell is configured such that there are three charged program levels for the first and second program levels to be selected from.

16. The method according to claim 15, wherein the wherein the first program state and the second program state are the same.

17. The method according to claim 1, wherein the blank program level is associated with a voltage distribution having a maximum value corresponding to the shifted erase state threshold voltage and a minimum value set by a shifted soft-program verify reference value.

18. The method according to claim 17, wherein the soft-program verify reference value is greater than a depletion device threshold voltage of the memory device.

19. A method of programming a charge trapping dielectric memory device having a first charge storing cell and a second charge storing cell, comprising:

programming the first charge storing cell to store a first amount of charge corresponding to a charged program level;

programming the second charge storing cell to store a second amount of charge corresponding to the charged program level; and verifying that the second programmed charge storing cell stores charge corresponding to the charged program level and if the verification fails, re-pulsing each of the first programmed charge storing cell and the second programmed charge storing cell.

20. The method according to claim 19, wherein during re-pulsing the first programmed charge storing cell is re-pulsed and then the second programmed charge storing cell is repulsed.

21. The method according to claim 19, wherein charge stored by the first programmed charge storing cell is not verified.

22. The method according to claim 19, wherein the charged program level is selected from a plurality of charged program levels.

23. The method according to claim 19, wherein the charge storing cell programmed first is susceptible to losing charge at a faster rate than the charge storing cell programmed second.

24. The method according to claim 19, further comprising reading the second programmed charge storing cell to determine a data value corresponding to the charged program level.

25. The method according to claim 24, wherein the charge storing cells are regions of a charge storing layer that is operatively arranged with a first conductive region adjacent the first charge storing cell, a second conductive region adjacent the second charge storing cell and a gate electrode and during reading, a voltage potential is applied to the conductive region adjacent the unread one of the charge storing cells, the voltage potential being less than one volt.

26. The method according to claim 25, wherein the voltage potential applied to the conductive region adjacent the unread one of the charge storing cells is about 0.4 volts to about 0.7 volts.

27. The method according to claim 19, wherein the charge storing cells are regions of a charge storing layer that is operatively arranged with a first conductive region adjacent the first charge storing cell, a second conductive region adjacent the second charge storing cell and a gate electrode and storing the charge program level for each charge storing cell respectively includes applying a source bias voltage potential to the conductive region adjacent the programmed charge storing cell.

28. A method of programming a charge trapping dielectric memory device having a first charge storing cell and a second charge storing cell, comprising:

programming the first charge storing cell to store a first amount of charge corresponding to a charged program level;

programming the second charge storing cell to store a second amount of charge corresponding to the charged program level; and verifying that the first programmed charge storing cell stores charge corresponding to the charged program level and if the verification fails, re-pulsing each of the first programmed charge storing cell and the second programmed charge storing cell.

* * * * *